(12) United States Patent
Kisaka

(10) Patent No.: US 7,702,012 B2
(45) Date of Patent: Apr. 20, 2010

(54) INFINITE IMPULSE RESPONSE FILTER CIRCUIT AND MAGNETIC DISK DRIVE

(75) Inventor: Masashi Kisaka, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 641 days.

(21) Appl. No.: 11/653,080

(22) Filed: Jan. 11, 2007

(65) Prior Publication Data

US 2007/0189375 A1 Aug. 16, 2007

(30) Foreign Application Priority Data

Jan. 12, 2006 (JP) .............................. 2006-005294

(51) Int. Cl.
*H03H 7/40* (2006.01)
(52) U.S. Cl. ...................................... 375/232
(58) Field of Classification Search ................ 375/143, 375/152, 229, 230, 343, 232; 379/390.02; 370/290, 291; 455/213, 339; 708/314; 704/204
See application file for complete search history.

(56) References Cited

U.S. PATENT DOCUMENTS

| 5,963,273 | A * | 10/1999 | Boie et al. | 348/725 |
|---|---|---|---|---|
| 7,558,352 | B2 * | 7/2009 | Bilgic et al. | 375/350 |
| 2003/0194002 | A1 * | 10/2003 | Corless et al. | 375/229 |
| 2003/0235244 | A1 * | 12/2003 | Pessoa et al. | 375/232 |

* cited by examiner

*Primary Examiner*—Sam K Ahn
(74) *Attorney, Agent, or Firm*—Townsend and Townsend and Crew LLP; Patrick Duncan

(57) ABSTRACT

An infinite impulse response (IIR) filter circuit in accordance with an embodiment of the invention has transfer function coefficients that are adaptively changed. Using a Nth-order polynomial A(z) and a polynomial B(z) whose order is not higher than N, the transfer function is defined by $$L(z) = \frac{B(z)}{A(z)};$$

where $$\prod_{i=0}^{-1} (z^2 + 1 - 2k_i z) = 1$$

is also defined. The polynomial A(z) is transformed to make the term of the Nth power of z equal to 1. If the order of the polynomial A(z) is even, the polynomial A(z) is determined to satisfy the condition:

$$A(z) = \frac{1}{1+l} \left( \prod_{i=0}^{N/2-1} (z^2 + 1 - 2k_{2i}z) + l(z^2 - 1) \prod_{i=0}^{N/2-2} (z^2 + 1 - 2k_{2i+1}z) \right)$$

If the order N is odd, the polynomial A(z) is determined to satisfy the condition:

$$A(z) =$$
$$\frac{1}{1+l} \left( (z+1) \prod_{i=0}^{(N-1)/2-1} (z^2 + 1 - 2k_{2i}z) + l(z-1) \prod_{i=0}^{(N-1)/2-1} (z^2 + 1 - 2k_{2i+1}z) \right)$$

where l and $k_i$ (i=0, 1, 2,,,) are real numbers.

4 Claims, 3 Drawing Sheets

INFINITE IMPULSE RESPONSE FILTER CIRCUIT AND MAGNETIC DISK DRIVE

CROSS-REFERENCE TO RELATED APPLICATION

The instant nonprovisional patent application claims priority to Japanese Patent Application No. 2006-005294, filed Jan. 12, 2006 and incorporated by reference herein for all purposes.

BACKGROUND OF THE INVENTION

To read/write information at a position on a spinning recording medium in a magnetic disk drive such as a hard disk drive, motion control is performed to move a magnetic head to the read/write position. If shock is given from external during this motion control, positioning of the magnetic head to the read/write position is difficult. Therefore, it is recently considered to configure such a control circuit that external shock is detected by a sensor and the signal from the sensor, after processed by a filter, is used to correct the magnetic head position control signal or remove the affection of the external shock.

FIG. 4 shows an example of a magnetic disk drive where such a circuit configuration is applied. It comprises a magnetic recording medium 1, a magnetic head actuator 2, a read/write circuit 3, a controller circuit 4, a driver circuit 5, a shock sensor 6 and a feed-forward circuit 7. These respective components are accommodated in and fixed to a base B.

On the magnetic recording medium 1, a plurality of concentrical tracks are formed. Data is written within these tracks.

The magnetic head actuator 2 is driven by a voice coil motor VCM to pivot, which moves the magnetic head to a read/write position on the magnetic recording medium 1.

The read/write circuit 3 generates a recording signal from recording data, which is entered from the controller circuit 4, and outputs it to the magnetic head. In addition, this read/write circuit 3 generates regeneration data from the regeneration signal, which is output from the magnetic head, and outputs it to the controller circuit 4.

The controller circuit 4 exchanges recording data and regeneration data with a host. In addition, this controller circuit 4 generates a position error signal (PES) indicative of the magnetic head's deviation from the read/write position by using the servo signal recorded on the magnetic disk medium 1 and, based on this position error signal (PES), generates a feedback control signal for controlling the magnetic head so as not to deviate from the track.

To move the magnetic head to an information read/write position on the magnetic recording medium 1 as instructed from the host, the controller circuit 4 generates a control signal based on the instruction and corrects this control signal by adding/subtracting the feedback control signal to/from the control signal to generate a primary corrected control signal.

Further, the controller circuit 4 generates a secondary corrected control signal by adding/subtracting the primary corrected control signal to/from a feed-forward signal which is output from the feed-forward circuit 7.

From the controller circuit 4, the driver circuit 5 receives the secondary corrected control signal to control the voice coil motor VCM. To the voice coil motor VCM, the driver circuit 5 outputs a control current whose amplitude is determined according to the secondary corrected control signal.

If a shock is given to the magnetic disk drive, the shock sensor 6 outputs a digital value indicating the magnitude of the shock. The feed-forward circuit 7 comprises a phase shift filter circuit 11, an adaptation circuit 12 and a feed-forward filter 13 as shown in FIG. 5.

Here, transfer function P is used to represent the voice coil motor VCM while transfer function Gc represents the controller circuit. Then, the response characteristic Gm from the output of the feed-forward filter 13 to the magnetic head actuator 2 is given as below.

$$G_m = \frac{P}{1 + G_c P} \quad \text{(Equation 8)}$$

The phase shift filter circuit 11 receives the output signal of the shock sensor 6 as an input and shifts the phase of the output signal of the shock sensor 6 so that the phase of the output signal of the shock sensor 6 falls within a predetermined range (for example, ±π/2 radians) with respect to the phase of the signal when it has just passed the transfer function Gm given by Equation 8.

The adaptation circuit 12 receives the position error signal (PES) from the controller circuit 4 as an input and the output signal of the phase shift filter circuit 11 as an input. Based on the output signal of the phase shift filter circuit 11 and the position error signal (PES), this adaptation circuit 12 uses the LMS (Least Mean Square) algorithm to control the coefficients of the respective powers of z in the feed-forward filter 13 so as to make smaller the position error signal (PES).

The feed-forward filter 13 is a FIR (Finite Impulse Response) filter. The coefficients of the respective powers of z in its transfer function are controlled by the adaptation circuit 12. This feed-forward filter 13 filters the output signal of the shock sensor 6 and outputs it to the controller circuit 4 as a feed-forward signal.

In this conventional example, anti-shock dynamic feed-forward controlling of the amplitude of current supplied to the voice coil motor VCM can raise the shock resistance.

Defining Gbt as the shock transfer function from the base B to the magnetic head actuator 2, the transfer function Gff of the feed-forward filter 13 in the above-mentioned conventional magnetic disk drive should be set as below:

$$G_{ff} = -\frac{G_{bt}}{G_s} \quad \text{(Equation 9)}$$

where the Gs is the output signal of the shock sensor 6. Generally, however, to realize this type of transfer function, the feed-forward filter 13 is required to be an IIR (Infinite Impulse Response) filter, not a FIR (Finite Impulse Response) filter. Generally, the IIR filter is not always stable. For the IIR filter to stably operate, its coefficients must be set carefully.

However, in the case of the technique mentioned above as a conventional example where the filter's coefficients are changed adaptively, the filter is configured as a FIR filter since it is not yet possible to secure the stability if the filter is configured as an IIR filter.

BRIEF SUMMARY OF THE INVENTION

Embodiments in accordance with the present invention provide an infinite impulse response (IIR) filter circuit which can operate stably even when the coefficients are adaptively changed. The IIR filter circuit in accordance with an embodiment of the present invention has transfer function coefficients that are adaptively changed. Wherein using a Nth-order polynomial A(z) and a polynomial B(z) whose order is not higher than N, the transfer function is defined by $$L(z) = \frac{B(z)}{A(z)};$$

where $$\prod_{i=0}^{-1}(z^2+1-2k_iz)=1$$

is also defined. The polynomial A(z) is transformed to make the term of the Nth power of z equal to 1. If the order of the polynomial A(z) is even, the polynomial A(z) is determined so as to satisfy the condition:

$$A(z) = \frac{1}{1+l}\left(\prod_{i=0}^{N/2-1}(z^2+1-2k_{2i}z) + l(z^2-1)\prod_{i=0}^{N/2-2}(z^2+1-2k_{2i+1}z)\right)$$

If the order N is odd, the polynomial A(z) is determined so as to satisfy the condition:

$$A(z) =$$
$$\frac{1}{1+l}\left((z+1)\prod_{i=0}^{(N-1)/2-1}(z^2+1-2k_{2i}z) + l(z-1)\prod_{i=0}^{(N-1)/2-1}(z^2+1-2k_{2i+1}z)\right)$$

where l and $k_i$ (i=0, 1, 2 , , , ) are real numbers.

For a more complete understanding of the present invention, reference is made to the following detailed description taken in conjunction with the accompanying drawings.

DETAILED DESCRIPTION OF THE INVENTION

An object of an embodiment in accordance with the present invention is to provide an IIR filter circuit capable of operating stably while the coefficients are changed adaptively, and a magnetic disk drive capable of implementing anti-shock feed-forward control by using the IIR filter circuit.

To solve the above-mentioned problem of the conventional example, the present invention provides an infinite impulse response filter circuit whose transfer function's coefficients are adaptively changed wherein:

using a Nth-order polynomial A(z) and a polynomial B(Z) whose order is not higher than N, the transfer function is defined by $$L(z) = \frac{B(z)}{A(z)};$$ (Equation 1)

where $$\prod_{i=0}^{-1}(z^2+1-2k_iz)=1;$$ (Equation 3)

is also defined.

In one embodiment of the present invention, the polynomial A(Z) is transformed to make the term of the Nth power of z equal to 1.

If the order of the polynomial A(z) is even, the polynomial A(z) is determined so as to satisfy the condition $$A(z) = \frac{1}{1+l}\left(\begin{array}{c}\prod_{i=0}^{N/2-1}(z^2+1-2k_{2i}z) + \\ l(z^2-1)\prod_{i=0}^{N/2-2}(z^2+1-2k_{2i+1}z)\end{array}\right);$$ (Equation 4)

if the order N is odd, the polynomial A(z) is determined so as to satisfy the condition:

$$A(z) = \frac{1}{1+l}\left(\begin{array}{c}(z+1)\prod_{i=0}^{(N-1)/2-1}(z^2+1-2k_{2i}z) + \\ l(z-1)\prod_{i=0}^{(N-1)/2-1}(z^2+1-2k_{2i+1}z)\end{array}\right)$$ (Equation 5)

wherein l and $k_i$ (i=0, 1, 2 , , , ) are real numbers; and the coefficients of the polynomial A(z) are changed so as to satisfy:

l>0

1>$k_0$>$k_1$> . . . >$k_{N-2}$>−1 (Equation 6)

This allows the infinite impulse response filter circuit to stably operate even if the coefficients are adaptively changed and consequently enables its use for anti-shock feed-forward control in magnetic disk drives and the like.

Figure 4:
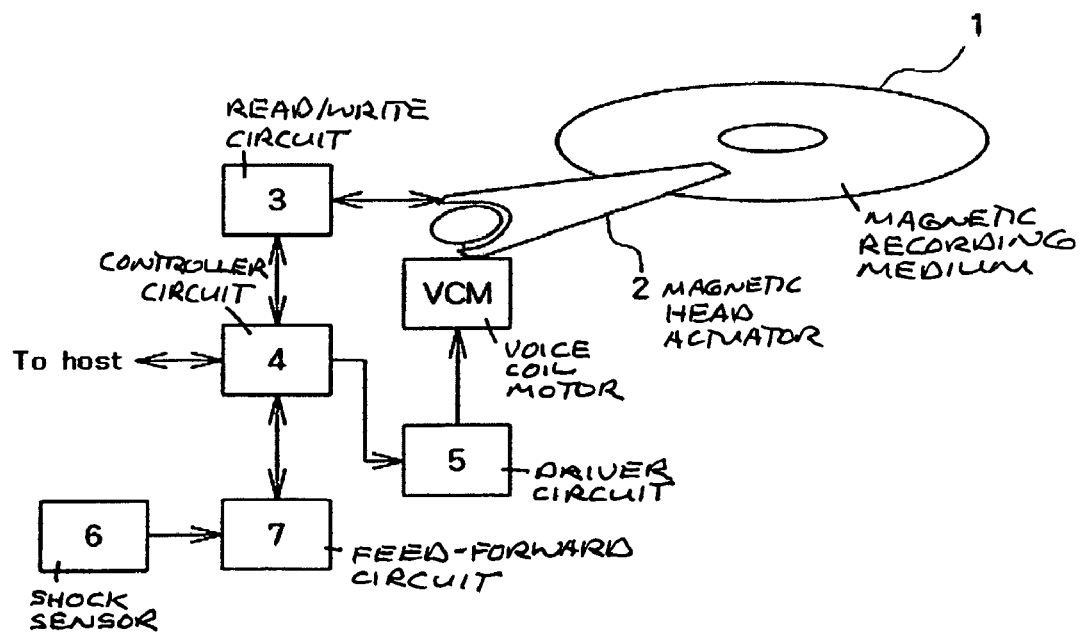
FIG. 4 is a block diagram showing the configuration of a conventional magnetic disk drive.
Figure 5:
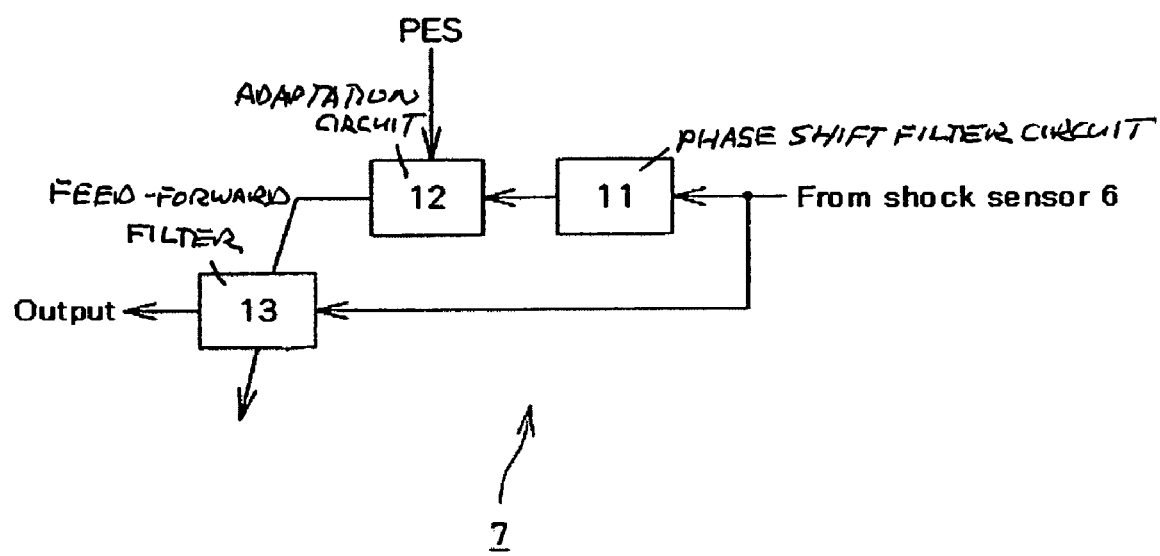
FIG. 5 is a block diagram showing an example of a conventional feed-forward circuit.

Embodiments of the present invention will be described below with reference to the drawings. To perform anti-shock feed-forward control, an infinite impulse response filter circuit 70 according to an embodiment of the present invention, instead of the feed-forward circuit 7, is installed in a magnetic disk drive similar to that shown in FIG. 4.

Figure 1:
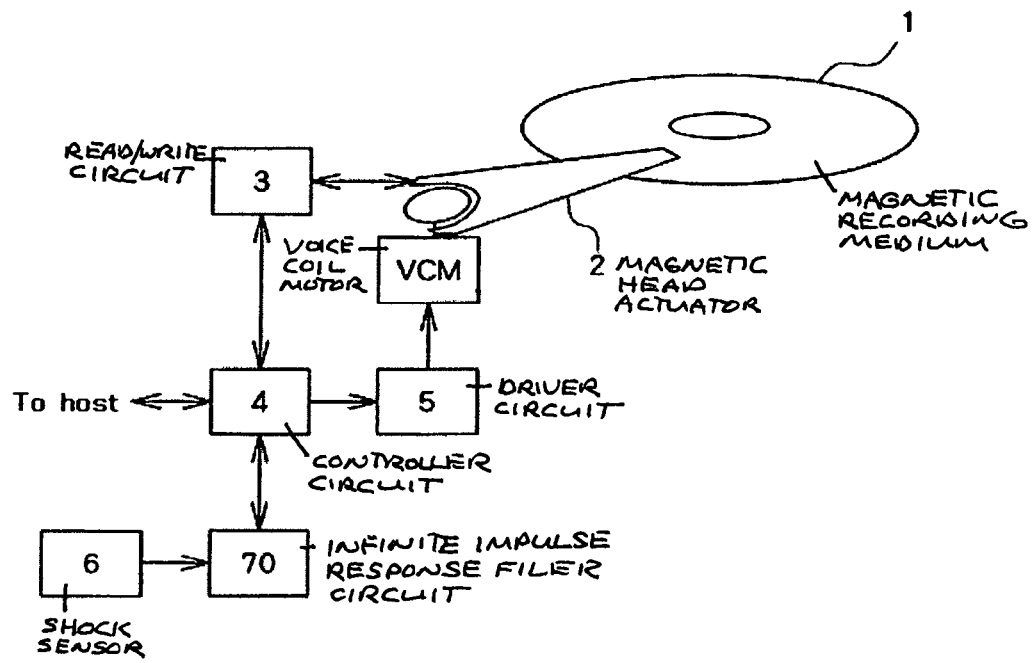
FIG. 1 is a block diagram showing the configuration of a magnetic disk drive in accordance with an embodiment of the present invention.

As shown in FIG. 1, this magnetic disk drive which uses the infinite impulse response filter circuit 70 comprises a magnetic recording medium 1, a magnetic head actuator 2, a read/write circuit 3, a controller circuit 4, a driver circuit 5 and a shock sensor 6 as well as the infinite impulse response filter circuit 70. These respective components are accommodated in and fixed to a base B.

Figure 2:
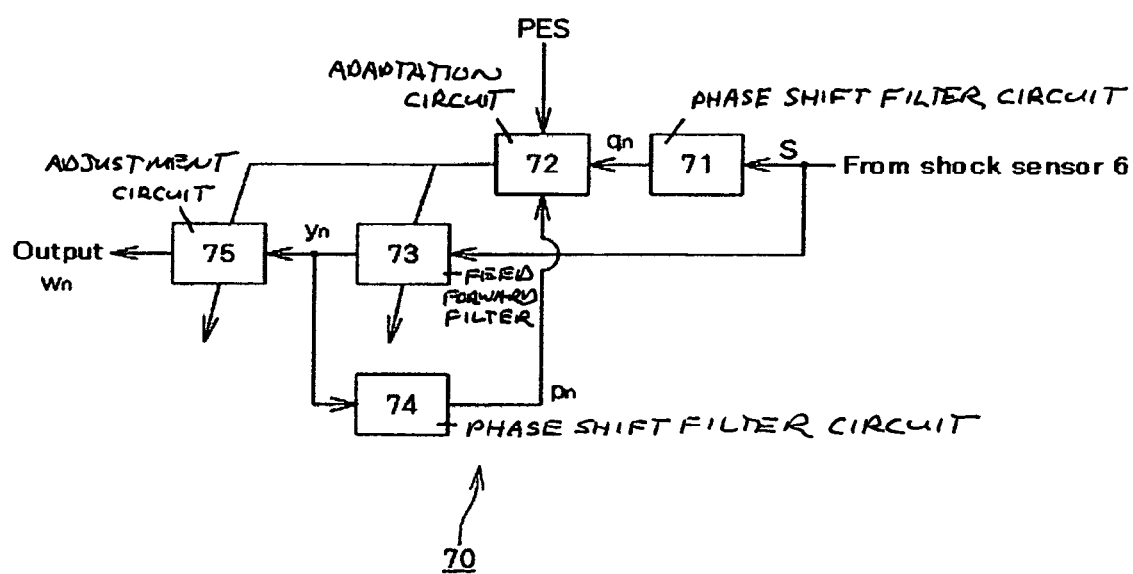
FIG. 2 is a functional block diagram of an infinite impulse response filter circuit in accordance with an embodiment of the present invention.

The infinite impulse response filter circuit 70 can be realized by using, for example, a DSP (Digital Signal Processor). As shown in FIG. 2, this infinite impulse response filter circuit 70 functionally comprises a first phase shift filter circuit 71, an adaptation circuit 72, a feed-forward filter 73, a second phase shift filter circuit 74 and an adjustment circuit 75.

The first phase shift filter circuit 71 is similar to the conventional phase shift filter circuit 11. It receives the output signal of the shock sensor 6 and shifts the phase of the output signal of the shock sensor 6 so that the phase of the output signal of the shock sensor 6 falls within a predetermined range (for example, ±π/2 radians) with respect to the phase of the signal when it has just passed the transfer function Gm given by Equation 8.

The adaptation circuit 72 is similar to the conventional adaptation circuit 12. It receives the position error signal (PES) entered from the controller circuit 4 and the output signals of the first and second phase shift filter circuits 71 and 74. Based on the output signals of the first and second phase shift filter circuits 71 and 74 and the position error signal (PES), this adaptation circuit 72 uses the LMS (Least Mean Square) algorithm to control the coefficients of the feed-forward filter 73 and those of the adjustment circuit 75 so as to make smaller the position error signal (PES). The method of controlling their coefficients will be described later.

According to an embodiment of the present invention, the feed-forward filter 73 is an infinite impulse response filter and its transfer function's coefficients are controlled by the adaptation circuit 72.

This feed-forward filter 73 filters the output signal of the shock sensor 6 and outputs it to the adjustment circuit 75 as a feed-forward signal. Its transfer function and others will be described later in detail.

The second phase shift filter circuit 74 receives the output signal of the feed-forward filter 73 and shifts the phase of the output signal of the feed-forward filter 73 so that the phase of the output signal of the feed-forward filter 73 falls within a predetermined range (for example, ±π/2 radians) with respect to the phase of the signal when it has just passed the transfer function Gm given by Equation 8.

The adjustment circuit 75 multiplies the output signal of the feed-forward filter 73 by the coefficients set by the adaptation circuit 72 and outputs the result to the controller circuit 4.

The following describes the function of the feed-forward filter 73. Generally, an IIR type filter L(z) may be written as below:

$$L(z) = \frac{B(z)}{A(z)} \quad \text{(Equation 10)}$$

where A(z) is a Nth-order polynomial of z and B(z) is a polynomial whose order of z is not higher than N.

The following discusses the condition for the feed-forward filter 73 to be stable. Since the process somewhat differs depending on whether the order N is even or odd, each case is separately considered below. Also note that it is assumed in the following description that the sampling time is 1 (second) and the unit of imaginary quantity is j in order to simplify the equations without losing the generality. In addition, A(z) is assumed to be positive when the frequency is "0". Even if A(z) has a negative value when the frequency is "0", it is possible to make A(z) positive at frequency "0" by multiplying the coefficients of B(z) by "−1".

Firstly, let the order N be even. A(z) may be written as:

$$A(z) = \sum_{i=0}^{N} a_i z^i \quad \text{(Equation 11)}$$

For simplification, M=N/2 is used to transform the equation to:

$$A(z) = z^M \left( \sum_{i=1}^{M} \frac{1}{2}(a_{M+i} + a_{M-i})\left(z^i + \frac{1}{z^i}\right) + a_M + \sum_{i=1}^{M}(a_{M+i} - a_{M-i})\left(z^i - \frac{1}{z^i}\right) \right) \quad \text{(Equation 12)}$$

On the unit circle in the z-plane, this equation (12) can be written as below:

$$A(e^{j\omega}) = e^{jM\omega}\left(\sum_{i=0}^{M} c_i \cos i\omega + j\sum_{i=0}^{M} d_i \sin i\omega\right) \quad \text{(Equation 13)}$$

Where:

$$c_0 = a_M \quad \text{(Equation 14)}$$
$$c_i = \frac{1}{2}(a_{M+i} + a_{M-i}) \, (i > 0)$$
$$d_i = \frac{1}{2}(a_{M+i} - a_{M-i})$$

Then, consider:

$$\frac{A(e^{j\omega})}{e^{jM\omega}} \quad \text{(Equation 15)}$$

As apparent, its real and imaginary parts are a Mth-order polynomial of cosine and a Mth-order polynomial of sine, respectively. The following equation corresponds to Equation 15.

$$G(z) = \frac{A(z)}{z^M} \quad \text{(Equation 16)}$$

The coefficients in Equation 14 are real. Therefore, as the frequency is varied from "0" to the Nyquist frequency according to the argument principle, the locus of G(z) revolves counterclockwise M/2 (=N/4) times around the origin in the complex plane, leaving all of the 2M zeros of A(z) as stable roots inside the unit circle.

Let $\omega_i$ (i=0, 1 ... ) be a frequency at which the polynomial A(z) traverses the imaginary axis and $\phi_i$ (i=0, 1 ... ) be a frequency at which the polynomial traverses the real axis. Thus, if the order N is even, the feed-forward filter 73 is stable if designed to satisfy the following condition:

$$\frac{A(e^{j\omega})}{e^{jM\omega}} = \prod_{i=0}^{M-1}(\cos\omega - \cos\omega_i) + j l \sin\omega \prod_{n=0}^{M-2}(\cos\omega - \cos\phi_n) \quad \text{(Equation 17)}$$

Where,

-continued $$l > 0 \quad \text{(Equation 18)}$$
$$0 < \omega_0 < \phi_0 < \omega_1 < \phi_1 < \ldots < \omega_{M-1} < \pi$$
and $$\prod_{n=0}^{-l}(\cos\omega - \cos\phi_n) = 1 \quad \text{(Equation 19)}$$

Actually, it is apparent that as the frequency is varied from "0" to the Nyquist frequency, the locus of G(z) starts from a positive point on the real axis, traverses the positive part of the imaginary axis at $\omega 0$ and then traverses the negative part of the real axis at $\phi 0$. Thus, the locus rotates counterclockwise just M/2 times. Equation 17 can be transformed into the form of Equation 13.

Further, by using:

$$\cos\omega = \frac{1}{2}\left(z + \frac{1}{z}\right) \quad \text{(Equation 20)}$$

$$j\sin\omega = \frac{1}{2}\left(z - \frac{1}{z}\right)$$

Equation 17 can be written as:

(Equation 21)

$$A(z) = z^M \prod_{i=0}^{M-1}\left(\frac{1}{2}\left(z + \frac{1}{z}\right) - \cos\omega_i\right) + \frac{l}{2}\left(z - \frac{1}{z}\right) \quad (15)$$
$$\prod_{n=0}^{M-2}\left(\frac{1}{2}\left(z + \frac{1}{z}\right) - \cos\phi_n\right)$$
$$= \prod_{i=0}^{M-1}\frac{1}{2}(z^2 + 1 - 2z\cos\omega_i) + \frac{l}{2}(z^2 - 1)$$
$$\prod_{n=0}^{M-2}\frac{1}{2}(z^2 + 1 - 2z\cos\phi_n)$$
$$= \left(\prod_{i=0}^{M-1}(z^2 + 1 - 2k_{2i}z) + l(z^2 - 1)\right)\frac{1}{2^M}$$
$$\prod_{n=0}^{M-2}(z^2 + 1 - 2k_{2n+1}z)$$

Where, $$1 > k_0(=\cos\omega_0) > k_1(=\cos\phi_0) > k_2 > \ldots > k_{N-2} > -1 \quad \text{(Equation 22)}$$

Since the Mth power of (½) is a coefficient having no relation with the stability, the following condition is obtained through division by the coefficient:

$$A(z) = \prod_{i=0}^{M-1}(z^2 + 1 - 2k_{2i}z) + l(z^2 - 1)\prod_{n=0}^{M-2}(z^2 + 1 - 2k_{2n+1}z) \quad \text{(Equation 23)}$$

Equations 22 and 23 are the condition for the feed-forward filter 73 to be stable if the order N is even.

Then, let the order of the polynomial A(z) is odd. Consider the following equation which corresponds to Equation 16:

$$G(z) = \frac{A(z)}{z^{M+1/2}} \quad \text{(Equation 24)}$$

As the frequency is varied from "0" to the Nyquist frequency, the locus of G(z) makes (M/2+1/4) revolutions clockwise in the complex plane, leaving all of the (2M+1) zeros of A(z) as stable roots inside the unit circle.

That is, the feed-forward filter 73 is stable if the coefficients satisfy the following constraints:

$$l > 0$$

$$1 > k_0 > k_i > \ldots > k_{N-2} > -1 \quad \text{(Equation 6)}$$

Similar to the description which follows Equation 17, the following condition is obtained based on this constraint:

(Equation 25)

$$\frac{A(e^{j\omega})}{e^{j(M+1/2)\omega}} =$$
$$\cos\frac{\omega}{2}\prod_{i=0}^{M-1}(\cos\omega - \cos\omega_i) + jl\sin\frac{\omega}{2}\prod_{n=0}^{M-1}(\cos\omega - \cos\phi_n)$$

Where, (Equation 26)

$$l > 0$$
$$0 < \omega_0 < \phi_0 < \omega_1 < \phi_1 < \cdots < \omega_{M-1} < \pi \text{ and}$$

(Equation 27)

$$\prod_{i=0}^{-l}(\cos\omega - \cos\omega_i) = 1 \quad (20)$$

$$\prod_{n=0}^{-l}(\cos\omega - \cos\phi_n) = 1 \quad (21)$$

By using:

$$\cos\omega = \frac{1}{2}\left(z + \frac{1}{z}\right) \quad \text{(Equation 28)}$$

$$j\sin\omega = \frac{1}{2}\left(z - \frac{1}{z}\right)$$

$$\cos\frac{\omega}{2} = \frac{1}{2}\left(z^{1/2} + \frac{1}{z^{1/2}}\right)$$

$$j\sin\frac{\omega}{2} = \frac{1}{2}\left(z^{1/2} - \frac{1}{z^{1/2}}\right)$$

A(Z) is transformed as below:

(Equation 29)

$$A(z) = z^{M+1/2} \frac{1}{2}\left(z^{1/2} + \frac{1}{z^{1/2}}\right) \prod_{i=0}^{M-1}\left(\frac{1}{2}\left(z + \frac{1}{z}\right) - \cos \omega_i\right) +$$

$$l\frac{1}{2}\left(z^{1/2} + \frac{1}{z^{1/2}}\right) \prod_{n=0}^{M-1}\left(\frac{1}{2}\left(z + \frac{1}{z}\right) - \cos \phi_n\right)$$

$$= \frac{1}{2}(z+1) \prod_{i=0}^{M-1} \frac{1}{2}(z^2 + 1 - 2z \cos \omega_i) +$$

$$l\frac{1}{2}(z-1) \prod_{n=0}^{M-1} \frac{1}{2}(z^2 + 1 - 2z \cos \phi_n)$$

$$= \left((z+1) \prod_{i=0}^{M-1}(z^2 + 1 - 2k_{2i}z) + l(z-1)\right.$$

$$\left.\prod_{n=0}^{M-1}(z^2 + 1 - 2k_{2i+1}z)\right) \frac{1}{2^M} \quad (22)$$

Where, $$1 > k_0 > k_1 > k_2 > \cdots > k_{N-2} > -1 \quad \text{(Equation 30)}$$

Through division by the Mth power of (½) which is not related with the stability, the following condition is obtained:

$$A(z) = \quad \text{(Equation 31)}$$

$$(z+1) \prod_{i=0}^{M-1}(z^2 + 1 - 2k_{2i}z) + l(z-1) \prod_{n=0}^{M-2}(z^2 + 1 - 2k_{2i+1}z)$$

If N is odd, stability is secured if Equations 30 and 31 are met.

B(z), which is the numerator of the transfer function of the feed-forward filter 73, can be expressed as below regardless of whether the order N is even or odd:

$$B(z) = \sum_{i=0}^{N} b_i z^i \quad \text{(Equation 32)}$$

Here, A(Z) in either Equation 23 or Equation 31 is divided by (1+l) to make the coefficient of the highest-order term equal to "1". The resulting E(z) is assumed as the denominator of the transfer function. The coefficient (1+l) will be multiplied later in the adjustment circuit 75. Accordingly, defining:

$$E(z) = \frac{A(Z)}{1+l} \quad \text{(Equation 33)}$$

the feed-forward filter 73 according to the present embodiment is expressed as:

$$\frac{B(z)}{E(z)} \quad \text{(Equation 34)}$$

Note that if N is even, A(z) in Equation 33 is that expressed by Equation 23. As well, if N is oven, A(z) there is that expressed by Equation 31.

For example, if N=4, A(z) is as below according to Equation 23:

(Equation 35)

$$A(z) = (z^2 + 1 - 2k_0 z)(z^2 + 1 - 2k_2 z) + l(z^2 - 1)(z^2 + 1 - 2k_1 z) \quad (28)$$

$$= (1+l)\left(z^4 + \frac{a_3}{1+l}z^3 + \frac{a_2}{1+l}z^2 + \frac{a_1}{1+l}z + \frac{a_0}{1+l}\right)$$

Thus, E(Z) is as below:

$$E(z) = \left(z^4 + \frac{a_3}{1+l}z^3 + \frac{a_2}{1+l}z^2 + \frac{a_1}{1+l}z + \frac{a_0}{1+l}\right) \quad \text{(Equation 36)}$$

Where, $$l > 0 \quad \text{(Equation 37)}$$
$$1 > k_0 > k_1 > k_2 > -1$$
$$a_3 = -2k_0 - 2k_2 - 2k_1 l$$
$$a_2 = 2 + 4k_0 k_2$$
$$a_1 = -2k_0 - 2k_2 + 2k_1 l$$
$$a_0 = 1 - l$$

The feed-forward filter 73 filters the output signal of the shock sensor 6 through the transfer function B(z)/E(z) divided by (1+l), namely:

$$G_f = \frac{\frac{1}{1+l}\sum_{i=0}^{4} b_i z^i}{E(z)} \quad \text{(Equation 38)}$$

The filtered output signal is output to the adjustment circuit 75 as the feed-forward signal. The adjustment circuit 75 multiplies this feed-forward signal by (1+l) and outputs it.

Thus, the output $w_n$ of the adjustment circuit 75 to the controller circuit 4 is:

$$w_n = (1+l)y_n = -\sum_{i=1}^{4} a_{4-i} y_{n-i} + \sum_{m=0}^{4} b_{4-m} s_{n-m} \quad \text{(Equation 39)}$$

Where, $S_n$ is the output of the shock sensor 6 at time n and $y_n$ is the output of the feed-forward circuit 73.

The controller circuit 4 exchanges recording data and regeneration data with a host. In addition, this controller circuit 4 generates a position error signal (PES) indicative of the magnetic head's deviation from the read/write position by using the servo signal recorded on the magnetic disk medium 1 and, based on this position error signal (PES), generates a feedback control signal for controlling the magnetic head so as not to deviate from the track.

To move the magnetic head to an information read/write position on the magnetic recording medium 1 as instructed from the host, the controller circuit 4 generates a control signal based on the instruction and corrects this control signal by adding/subtracting the feedback control signal to/from the control signal to generate a primary corrected control signal.

Further, the present controller circuit embodiment 4 generates a secondary corrected control signal by adding/subtracting the primary corrected control signal to/from the output signal of the adjustment circuit 75.

From the controller circuit 4, the driver circuit 5 receives the secondary corrected control signal to control the voice coil motor VCM. To the voice coil motor VCM, the driver circuit 5 outputs a control current whose amplitude is determined according to the secondary corrected control signal.

Receiving the position error signal (PES) from the controller circuit 4 as an input and the output signals of the first and second phase shift filter circuits 71 and 74 as inputs, the adaptation circuit 72 uses the LMS (Least Mean Square) algorithm to control the coefficients of the respective powers of z in the feed-forward filter 73 and those in the adaptation circuit 75 so as to make smaller the position error signal (PES). This coefficient control method is described below.

The adaptation circuit 72 uses the square of the position error signal (PES) as evaluation function $E_n$ as below:

$$E_n = PES^2 \equiv e_n^2 = \left(\sum_{i=0}^{\infty} f_i D_{n-i} + \sum_{i=0}^{\infty} f_i w_{n-i}\right)^2 \quad \text{(Equation 40)}$$

$$\equiv (d_n + X_n)^2$$

Where, $$f_0, f_1, f_2, f_3 \ldots \quad \text{(Equation 41)}$$

is the impulse response of:

$$\frac{P}{1 + G_c P} \quad \text{(Equation 42)}$$

and $D_{n-i}$ is the affection (S3) of disturbance shock to the VCM input at time n-i.

From Equation 39, $X_n$ can be transformed to:

$$X_n = \sum_{i=0}^{\infty} f_i w_{n-i} \quad \text{(Equation 43)}$$

$$= \sum_{i=0}^{\infty} f_i \left(-\sum_{k=1}^{4} a_{4-k} y_{n-i-k} + \sum_{m=0}^{4} b_{4-m} s_{n-i-m}\right)$$

$$= -\sum_{k=1}^{4} a_{4-k} \sum_{i=0}^{\infty} f_i y_{n-i-k} + \sum_{m=0}^{4} b_{4-m} \sum_{i=0}^{\infty} f_i s_{n-i-m}$$

$$= -\sum_{k=1}^{4} a_{4-k} p_{n-k} + \sum_{m=0}^{4} b_{4-m} q_{n-m}$$

Where, $p_n$ is the output of the following transfer function, that is, the output signal of the second phase shift filter circuit 74 when $y_n$ is entered:

$$\frac{P}{1 + G_c P} \quad \text{(Equation 42)}$$

and $q_n$ is the output of the following transfer function, that is the output signal of the first phase shift filter circuit 71, when $s_n$ is entered:

$$\frac{P}{1 + G_c P} \quad \text{(Equation 42)}$$

Accordingly, it is expectable that $E_n$ is made smaller by partially differentiating $E_n$ by each of l, $k_0, \ldots, k_{N-2}$, $b_0$, $b_1 \ldots b_N$ and decreasing/increasing the coefficient if the derivative is positive/negative. Namely, in the case of the fourth order, each partial derivative is calculated as below:

$$\frac{\partial}{\partial l} E_n = 2e_n \frac{\partial}{\partial l} = 2e_n(2k_1 p_{n-1} - 2k_1 p_{n-3} + p_{n-4}) \quad \text{(Equation 44)}$$

$$\frac{\partial}{\partial k_0} E_n = 2e_n(2p_{n-1} - 4k_2 p_{n-2} + 2p_{n-3})$$

$$\frac{\partial}{\partial k_1} E_n = 2e_n 2l(p_{n-1} - p_{n-3})$$

$$\frac{\partial}{\partial k_2} E_n = 2e_n(2p_{n-1} - 4k_0 p_{n-2} + 2p_{n-3})$$

$$\frac{\partial}{\partial b_4} E_n = 2e_n q_n$$

$$\frac{\partial}{\partial b_3} E_n = 2e_n q_{n-1}$$

$$\frac{\partial}{\partial b_2} E_n = 2e_n q_{n-2}$$

$$\frac{\partial}{\partial b_1} E_n = 2e_n q_{n-3}$$

$$\frac{\partial}{\partial b_0} E_n = 2e_n q_{n-4}$$

For example, $k_1$ is updated as below:

$$k_1(n) = k_1(n-1) - 2\mu e_n 2l(n-1)(p_{n-1} - p_{n-3}) \quad \text{(Equation 45)}$$

Where, $k_1(n)$ and $l(n)$ are respectively $k_1$ and $l$ at time n and $\mu$ is a LMS convergence parameter.

The adaptation 72 checks whether each thus calculated coefficient satisfies the following constraint:

$$l > 0$$

$$1 > k_0 > k_1 > \ldots > k_{N-2} > -1 \quad \text{(Equation 6)}$$

If the constraint is not satisfied, the coefficient is adjusted by a predetermined process so as to satisfy the constraint. Its detailed description is omitted here since it is mathematically easy to adjust the coefficient so as to satisfy the above-mentioned constraint while making smaller the evaluation function $E_n$.

This constraint may be stricter as below:

$$\beta > 1 > \alpha$$

$$1 - \gamma_0 > k_0 > k_1 + \delta_0$$

$$k_0 - \gamma_1 > k_1 > k_2 + \delta_1$$

...

$$k_{N-3} - \gamma_{N-2} > k_{N-2} > -1 + \delta_{N-2} \quad \text{(Equation 7)}$$

Where, both $\alpha$ and $\beta$ are positive numbers. $\alpha$, $\gamma_i$ and $\sigma_i$ are designed to be smaller than the predetermined upper limits while $\beta$ is designed to be larger than the predetermined lower limit. This can enlarge the stability margin.

Figure 3:
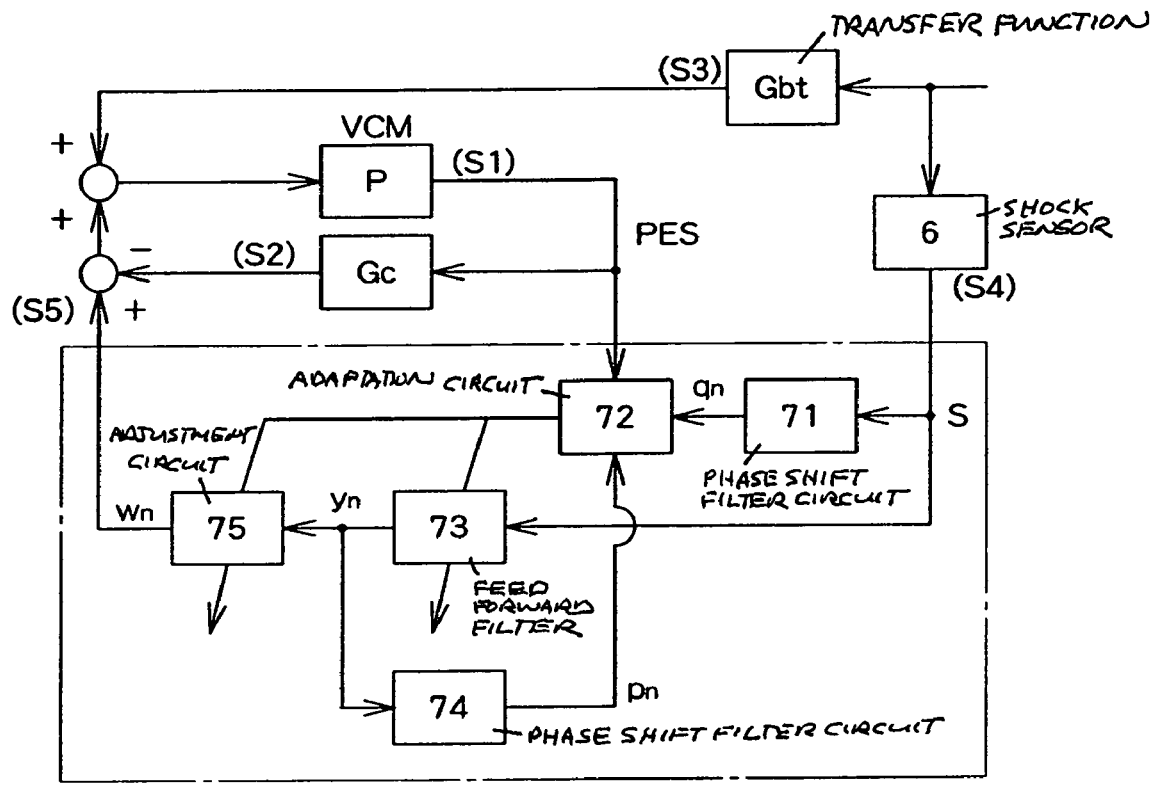
FIG. 3 is a schematic diagram provided to explain how the magnetic disk drive operates in accordance with an embodiment of the present invention operates.

In the magnetic disk drive embodiment of the present invention, the controller circuit 4 exchanges recording data and regeneration data with the host. In addition, as shown in FIG. 3, the controller circuit 4 generates a position error signal (PES)(S1) indicative of the magnetic head's deviation from the read/write position by using the servo signal recorded on the magnetic recording medium 1 and, based on the position error signal (PES), generates a feedback control signal (S2) to control the position of the magnetic head so as not to deviate from the track.

Shock given to the base B is transferred from the base B to the magnetic head actuator 2 via transfer function Gbt (S3). Consequently, the output of the driver circuit 5 includes an error. This error has influence on the magnetic head's output signal (PES) through the transfer function P of the VCM.

Meanwhile, the shock sensor 6 outputs a digital value (S4) indicating the magnitude of the shock given to the base B of the magnetic disk drive. This output signal is entered into the infinite impulse response filter circuit 70. The infinite impulse response filter circuit 70 generally has such a transfer function as expressed by Equation 10. A(z) is designed to satisfy Equation 23 if the order N is even. Likewise A(z) is designed to satisfy Equation 31 if the order N is odd. The coefficients are gradually updated by the LMS algorithm so as to satisfy the following constraint:

$$l > 0$$

$$1 > k_0 > k_1 > \ldots > k_{N-2} > -1 \quad \text{(Equation 6)}$$

or $$\beta > l > \alpha$$

$$1 - \gamma_0 > k_0 > k_1 + \delta_0$$

$$k_0 - \gamma_1 > k_1 > k_2 + \delta_1$$

...

$$k_{N-3} - \gamma_{N-2} > k_{N-2} > -1 + \delta_{N-2} \quad \text{(Equation 7)}$$

Where, both $\alpha$ and $\beta$ are positive numbers. $\alpha$, $\gamma_i$ and $\sigma_i$ are designed to be smaller than the predetermined upper limits while $\beta$ is designed to be larger than the predetermined lower limit.

The feedback control signal is subtracted from output signal (feed-forward signal) wn of this infinite impulse response filter circuit 70 and the result (S5) is added to the VCM control signal. Consequently, the signal obtained by subtracting the feedback signal from the feed-forward signal has influence on the output signal (PES) of the magnetic head via the transfer function P of the VCM.

That is, to move the magnetic head to an information read/write position on the magnetic recording medium 1 as instructed from the host, the controller circuit 4 generates a control signal based on the instruction and corrects this control signal by adding/subtracting the feedback control signal to/from the control signal to generate a primary corrected control signal. Further, the controller circuit 4 generates a secondary corrected control signal by adding/subtracting the primary corrected control signal to/from a feed-forward signal which is output from the infinite impulse response filter circuit 70. From the controller circuit 4, the driver circuit 5 receives the secondary corrected control signal to control the voice coil motor VCM. To the voice coil motor VCM, the driver circuit 5 outputs a control current whose amplitude is determined according to the secondary corrected control signal. Thus, the VCM control signal is corrected so as to cancel the influence of the shock.

In the embodiment described above, the coefficients of the infinite impulse response type filter circuit are gradually updated by the LMS algorithm or the like. In this process, the denominator function of the transfer function is determined so as to satisfy Equation 23 or 31 depending on whether the order of the denominator function is even or odd so that stability can always be secured under a relatively easy-to-satisfy constraint.

This realizes a filter circuit which has a transfer function of the Equation 9 type but can operate stably, that is, provides an IIR filter circuit capable of improving anti-shock response by adaptively changing the coefficients to secure stable operation and consequently provides a magnetic disk drive capable of implementing anti-shock feed-forward control by using such an IIR filter circuit.

What is claimed is:

1. An infinite impulse response filter circuit whose transfer function's coefficients are adaptively changed wherein:

using a Nth-order polynomial A(z) and a polynomial B(z) whose order is not higher than N, the transfer function is defined by $$L(z) = \frac{B(z)}{A(z)}$$

where $$\prod_{i=0}^{-1} (z^2 + 1 - 2k_i z) = 1$$

when the polynomial A(z) is transformed to make the term of the Nth power of z equal to 1, if the order of the polynomial A(z) is even, the polynomial A(z) is determined so as to satisfy the condition;

$$A(z) = \frac{1}{1+l}\left(\prod_{i=0}^{N/2-1}(z^2 + 1 - 2k_{2i}z) + l(z^2 - 1)\prod_{i=0}^{N/2-2}(z^2 + 1 - 2k_{2i+1}z)\right); \text{ and}$$

if the order N is odd, the polynomial A(z) is determined so as to satisfy the condition $$A(z) = \frac{1}{1+l}\left((z+1)\prod_{i=0}^{(N-1)/2-1}(z^2+1-2k_{2i}z)+l(z-1)\prod_{i=0}^{(N-1)/2-1}(z^2+1-2k_{2i+1}z)\right)$$

wherein l and $k_i$ (i=0, 1, 2,,,) are real numbers; wherein the infinite impulse response filter circuit is in communication with a voice coil motor to control a position of a magnetic head actuator relative to a magnetic recording medium.

2. A magnetic disk drive containing a feed-forward circuit wherein:
the feed-forward circuit includes an infinite impulse response filter circuit and a circuit to adaptively change the coefficients of the infinite impulse response filter circuit;
the infinite impulse response filter circuit whose transfer function's coefficients are adaptively changed wherein:
using a Nth-order polynomial A(z) and a polynomial B(z) whose order is not higher than N, the transfer function of the infinite impulse response filter circuit is defined by $$L(z) = \frac{B(z)}{A(z)}$$

where $$\prod_{i=0}^{-1}(z^2+1-2k_iz) = 1$$

when the polynomial A(z) is transformed to make the term of the Nth power of z equal to 1,
if the order of the polynomial A(z) is even, the polynomial A(z) is determined so as to satisfy the condition $$A(z) = \frac{1}{1+l}\left(\prod_{i=0}^{N/2-1}(z^2+1-2k_{2i}z)+l(z^2-1)\prod_{i=0}^{N/2-2}(z^2+1-2k_{2i+1}z)\right)$$

if the order N is odd, the polynomial A(z) is determined so as to satisfy the condition $$A(z) = \frac{1}{1+l}\left((z+1)\prod_{i=0}^{(N-1)/2-1}(z^2+1-2k_{2i}z)+l(z-1)\prod_{i=0}^{(N-1)/2-1}(z^2+1-2k_{2i+1}z)\right)$$

wherein l and $k_i$ (i=0, 1, 2,,,) are real numbers.

3. The magnetic disk drive according to claim 2 wherein:
the circuit to adaptively change the coefficients changes the coefficients of the infinite impulse response filter circuit while satisfying the constraint l>0

$1<k_0>k_1>\ldots>k_{N-2}>-1$.

4. The magnetic disk drive according to claim 2 wherein:
the circuit to adaptively change the coefficients changes the coefficients of the infinite impulse response filter circuit while satisfying the constraint

β>1>α

$1-\gamma_0 k_0 > k_1 + \delta_0$

. . .

$k_{N-3}-\gamma_{N-2}>k_{N-2}>-1+\delta_{N-2}$ where both α and β are positive numbers and α, $\gamma_i$ and $\sigma_i$ are designed to be smaller than their respective predetermined upper limits while β is designed to be larger than its predetermined lower limit.

* * * * *